United States Patent
Hung et al.

(10) Patent No.: US 9,520,477 B2
(45) Date of Patent: Dec. 13, 2016

(54) SEMICONDUCTOR DEVICE AND FABRICATING METHOD THEREOF

(71) Applicant: TAIWAN SEMICONDUCTOR MANUFACTURING COMPANY LTD., Hsinchu (TW)

(72) Inventors: Chi-Cheng Hung, Tainan (TW); Yu-Sheng Wang, Tainan (TW); Kei-Wei Chen, Tainan (TW); Ying-Lang Wang, Tai-Chung County (TW)

(73) Assignee: Taiwan Semiconductor Manufacturing Company, Hsinchu (TW)

( * ) Notice: Subject to any disclaimer, the term of this patent is extended or adjusted under 35 U.S.C. 154(b) by 0 days.

(21) Appl. No.: 14/658,505

(22) Filed: Mar. 16, 2015

(65) Prior Publication Data
US 2016/0276456 A1    Sep. 22, 2016

(51) Int. Cl.
*H01L 29/66* (2006.01)
*H01L 29/49* (2006.01)
*H01L 21/28* (2006.01)
*H01L 29/78* (2006.01)

(52) U.S. Cl.
CPC ..... *H01L 29/4966* (2013.01); *H01L 21/28088* (2013.01); *H01L 29/66568* (2013.01); *H01L 29/78* (2013.01)

(58) Field of Classification Search
CPC ...... H01L 21/49; H01L 29/66; H01L 29/4966; H01L 29/66568; H01L 29/28088
See application file for complete search history.

(56) References Cited

U.S. PATENT DOCUMENTS

| | | | |
|---|---|---|---|
| 5,241,571 A * | 8/1993 | Pati | C22C 16/00 376/260 |
| 2002/0040885 A1* | 4/2002 | Sharan | H01L 21/3065 216/2 |

(Continued)

FOREIGN PATENT DOCUMENTS

| | | |
|---|---|---|
| TW | 434865 | 5/2001 |
| TW | 201314902 | 4/2013 |

(Continued)

OTHER PUBLICATIONS

Office action dated Sep. 6, 2016 from the Taiwan counterpart application 104138928.

(Continued)

*Primary Examiner* — Phuc Dang
(74) *Attorney, Agent, or Firm* — Anthony King; WPAT, P.C.

(57) ABSTRACT

A semiconductor device includes a substrate, a first and second source/drain regions, and a gate stack. The first and second source/drain regions are disposed on the substrate. The gate stack is disposed over the substrate to overlay a channel region between the first and second S/D regions. The gate stack includes a gate dielectric layer disposed over the substrate; and a metal alloy disposed on the gate dielectric layer and configured as a filling layer in the gate stack; wherein the metal alloy has a first corrosion resistance corresponding to an etchant designed for removing a carbon-containing polymer.

19 Claims, 16 Drawing Sheets

(56) References Cited

U.S. PATENT DOCUMENTS

| | | | | |
|---|---|---|---|---|
| 2009/0302412 A1* | 12/2009 | Cheng | ............ | H01L 21/823807 |
| | | | | 257/506 |
| 2010/0181630 A1* | 7/2010 | Bu | ................... | H01L 21/28079 |
| | | | | 257/410 |
| 2012/0032268 A1* | 2/2012 | Hou | ................. | H01L 21/76816 |
| | | | | 257/368 |
| 2013/0241004 A1* | 9/2013 | Yin | ................ | H01L 21/823807 |
| | | | | 257/392 |

FOREIGN PATENT DOCUMENTS

| | | |
|---|---|---|
| TW | 201327724 | 7/2013 |
| TW | 201344914 | 11/2013 |

OTHER PUBLICATIONS

Search report dated Sep. 6, 2016 from the Taiwan counterpart application 104138928.

\* cited by examiner

SEMICONDUCTOR DEVICE AND FABRICATING METHOD THEREOF

BACKGROUND

Implementing a metal gate technology into metal-oxide-semiconductor field effect transistors (MOSFETs) not only improves a device performance, but also decreases the feature size. Generally speaking, the metal gate technology is a technology developed to replace the typically polysilicon gate electrode of a MOSFET with a metal gate (MG) electrode. One process of forming the MG electrode is termed "gate first" process while another MG electrode formation process is termed "gate last". For the "gate first" process, the MG electrode of the MOSFET is deposited before the high temperature activation anneal of the semiconductor process while for the "gate last" process the MG electrode is deposited after the high temperature activation anneal. Although the thermal requirements are loosened in the "gate last" process, the MG electrode may be corroded by the acid solutions during the chemical mechanical polishing or planarization (CMP) process of the gate stack.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAIL DESCRIPTION

Figure 1:
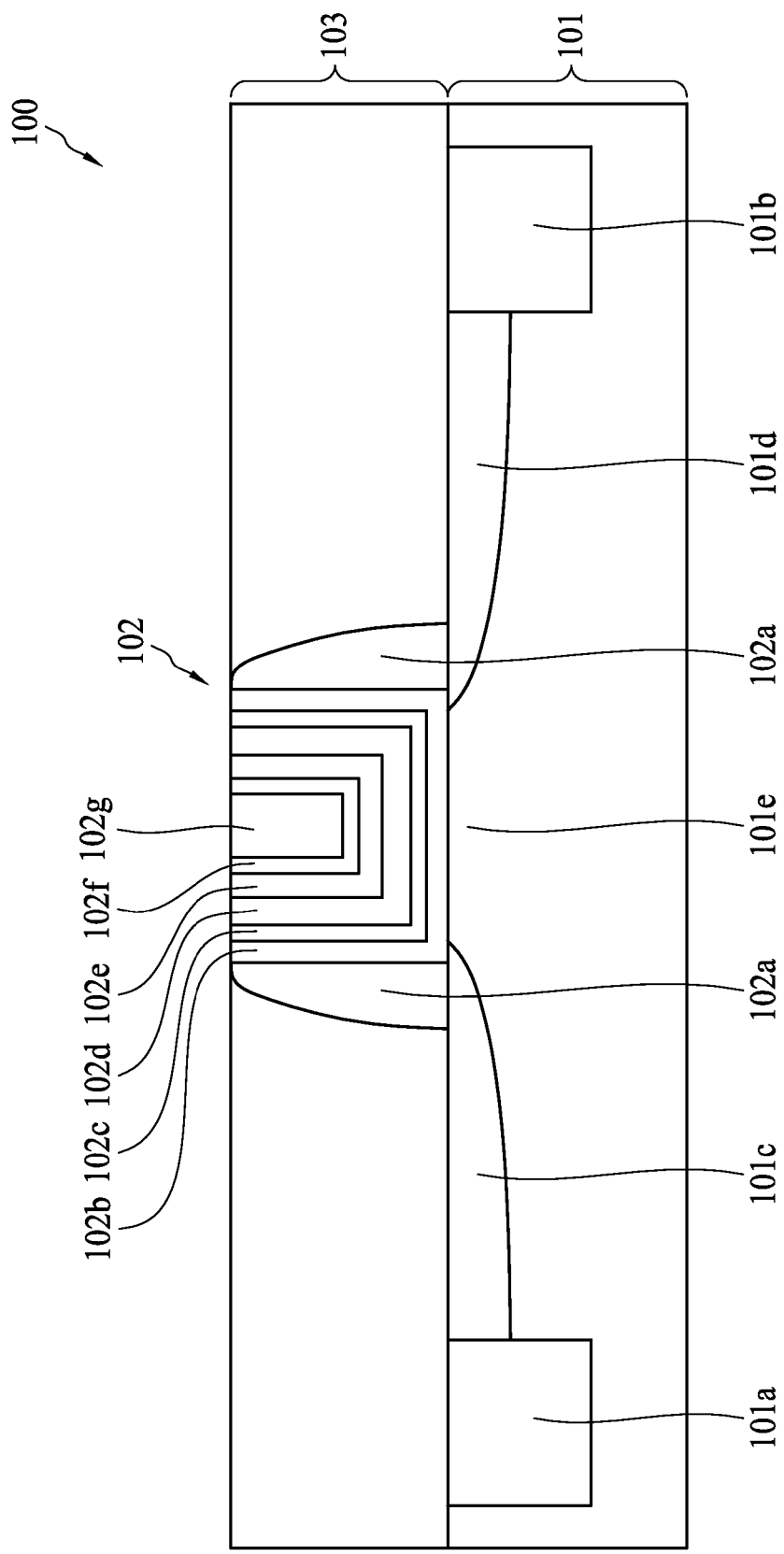
FIG. 1 is a cross-sectional view of a semiconductor device in accordance with some embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

In the present disclosure, a semiconductor device having a proposed material for metal gate and a method to manufacture the same is discussed. The semiconductor device may be any types of FET (Field Effect Transistor), such as N-type or P-type Fin-Shaped Field Effect Transistor (FinFET), an N-type or P-type Metal-oxide-semiconductor Field Effect Transistor (MOSFET), and a complementary metal-oxide-semiconductor (CMOS). The metal gate with the proposed material is configured to be a gate electrode for applying voltage upon the channel region of a FET, wherein the channel region is positioned between the source (S) and drain (D) regions of the FET. The channel region has a conductance depend on the applied voltage of the metal gate with the proposed material. When the applied voltage is equal to or greater than the threshold voltage of the FET, the channel region is conductive. Otherwise, the channel region is non-conductive. The metal gate with the proposed material is capable of resisting the corrosion caused by the sulphate solutions during the manufacturing process, e.g. the chemical mechanical polishing or planarization (CMP) process.

FIG. 1 is a cross-sectional view of a semiconductor device 100 in accordance with some embodiments. The semiconductor device 100 shows a cross-sectional structure of a FET. The semiconductor device 100 includes a substrate 101, a gate stack 102, and an interlayer dielectric layer (ILD) 103. The substrate 101 is a semiconductor substrate. At least one shallow trench isolation (STI) region is in the substrate 101. In the embodiments, a first shallow trench isolation (STI) region 101a and a second STI region 101b are in the substrate 101, and the FET is between the first STI region 101a and the second STI region 101b. The first STI region 101a and the second STI region 101b are configured as the isolation layers of the FET.

Some doped regions are arranged around the gate stack 102 to act as source/drain of the FET. For example, a first source/drain (S/D) region 101c and a second S/D region 101d are on/in the substrate 101, and the gate stack 102 is disposed over the substrate 101 to overlay a channel region 101e between the first S/D region 101c and the second S/D region 101d. The gate stack 102 is in the ILD 103. In an embodiment, the ILD 103 surrounds the gate stack 102.

The gate stack 102 includes a spacer 102a, a gate dielectric layer 102b, a capping layer 102c, a work function layer 102d, a blocking layer 102e, a wetting layer 102f, and a metal gate layer 102g. The spacer 102a is configured as a side wall of the gate stack 102. The spacer 102a is non-conductive. Examples of materials for the spacer 120a include, but are not limited to, silicon mononitride (SiN), silicon dioxide (SiO2), silicon-oxynitride (SiON), and the like.

The gate dielectric layer 102b may include high-k (high dielectric constant) material. The gate dielectric layer 102b is disposed over the substrate 101 (i.e. the channel region 101e) and adhered to the sidewall of the spacer 102a. In other words, the gate dielectric layer 102b surrounds the gate stack 102. However, this is not a limitation of the present invention. In another embodiment, the gate dielectric layer 102b is only disposed over the channel region 101e and does not spread over the sidewall of the spacer 102a. The material of the gate dielectric layer 102b may be lanthanum oxide (LaO), aluminium oxide (AlO, $Al_2O_3$), zirconium oxide (ZrO), zitanium oxide (TiO), tantalum oxide ($Ta_2O_5$), yttrium oxide ($Y_2O_3$), strontium titanate oxide ($SrTiO_3$), barium titanium oxide ($BaTiO_3$), barium zirconium oxide (BaZrO), hafnium zirconium oxide (HfZrO), hafnium lanthanum oxide (HfLaO), hafnium silicon oxide (HfSiO), lanthanum silicon oxide (LaSiO), aluminium silicon oxide (AlSiO), hafnium tantalum oxide (HfTaO), hafnium titanium oxide (HfTiO), silicon nitride ($Si_3N_4$), oxynitrides, or other suitable materials.

The capping layer 102c is configured to be a high-k capping layer disposing over the gate dielectric layer. The high-k capping layer may be a suitable high-k dielectric material such as, for example, titanium nitride (TiN), tantalum nitride (TaN), or metal carbonitride such as titanium carbonitride. The capping layer 102c functions as a barrier to protect the high-k layer in the gate dielectric layer 102b. The capping layer is formed by various deposition techniques such as atomic layer deposition (ALD), physical vapor deposition (PVD), chemical vapor deposition (CVD), plasma enhanced CVD (PECVD), remote plasma CVD (RPCVD), molecular organic CVD (MOCVD), sputtering, plating, other suitable method, or combinations thereof.

The work function layer 102d is disposed over the capping layer 102c. The work function layer 102d includes metal carbonitride such as TiN, metal silicon nitride such as titanium silicon nitride (TiSiN), or metal aluminide. In some embodiments, the work function layer 102d is made of metal carbonitride or metal silicon nitride. In other embodiments, the work function layer 102d may include titanium aluminum nitride (TiAlN), titanium aluminum (TiAl), or tantalum aluminum (TaAl). The work function layer 102d can be formed through various deposition techniques such as ALD, PVD, CVD, PECVD, RPCVD, MOCVD, sputtering, plating, other suitable method, or combinations thereof. For the NFET (N-channel Field Effect Transistor), the work function layer 102d is configured to be an N-metal layer. For the PFET (P-channel Field Effect Transistor), the work function layer 102d is configured to be a P-metal layer. It is noted that the N-metal layer and the P-metal layer may be configured to be composite film stacks respectively. The layer number of the N-metal layer may be different from the layer number of the P-metal layer.

The blocking layer 102e is disposed over or adjacent to the work function layer 102d. The blocking layer 102e is configured to prevent or reduce metal impurities from penetrating any dielectric layers disposed below the blocking layer 102e, e.g. the work function layer 102d. The material of the blocking layer 102e may be tantalum nitride (TaN) or TiAlN. The blocking layer 102e can be formed through various deposition techniques such as PVD, CVD, ALD, PECVD, RPCVD, MOCVD, sputtering, plating, other suitable method, or combinations thereof.

The wetting layer 102f is disposed over the blocking layer 102e. The wetting layer 102f is configured to provide desirable interface quality between the wetting layer 102f and any material layer formed over the wetting layer 102f. The material of the wetting layer 102f may be titanium (Ti), TiAl, or TiAlN. The wetting layer 102f can be formed through various deposition techniques such as PVD, CVD, ALD, PECVD, RPCVD, MOCVD, sputtering, plating, other suitable method, or combinations thereof. It is noted that the blocking layer 102e and the wetting layer 102f can also be implemented as a single layer by using the same material, e.g. TiAlN.

The metal gate layer 102g is disposed over or adjacent to the wetting layer 102f. The metal gate layer 102g can be formed through various deposition techniques such as PVD, CVD, ALD, PECVD, RPCVD, MOCVD, sputtering, plating, other suitable method, or combinations thereof. The proposed material for the metal gate layer 102g is a metal alloy at least including an alloying component of silicon (Si). In an embodiment, the metal alloy further has alloying components of copper (Cu) and aluminum (Al), i.e. Al—Si—Cu. Specifically, the percentage of silicon in the metal alloy is at least about 0.2% and the percentage of copper in the metal alloy is at least about 0.5%. Thus, the percentage of aluminum in the metal alloy is about 99.3% in the embodiments. It should be noted that the above percentages of those alloying components is not the limitation of the present invention. The percentages among the above alloying components may vary in accordance with the practical requirements of the designer or manufacturer. For example, in an embodiment, the percentage of silicon in the metal alloy may be from 0.2% to 6%. In another embodiment, the percentage of silicon in the metal alloy may be from 6% to 12%. In another embodiment, the percentage of silicon in the metal alloy may be from 12% to 18%.

Moreover, the term "metal alloy" should be understood to cover all forms of metal including the metal components of silicon, copper, and aluminum. For example, the aluminum doped with silicon element and copper element is a form of proposed metal alloy. The metal alloy having the alloying components of aluminum and copper doped with silicon element is another form of proposed metal alloy.

In the embodiments, the blocking layer 102e is configured to prevent or reduce the metal alloy of the metal gate layer 102g from penetrating to the work function layer 102d. The wetting layer 102f is configured to provide desirable interface quality between the wetting layer 102f and the metal gate layer 102g.

Figure 2:
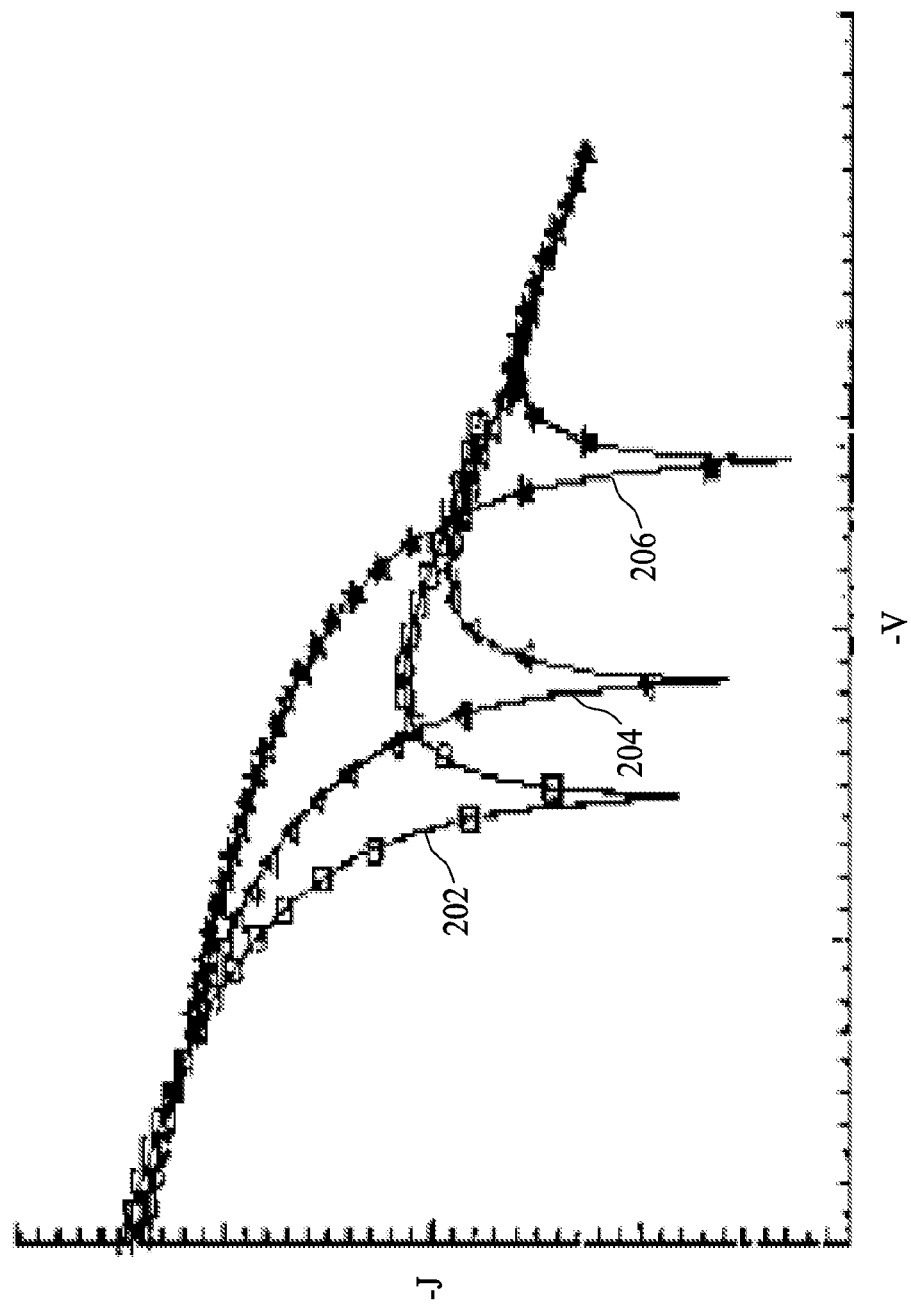
FIG. 2 is a diagram illustrating the corrosion behaviours of the pure aluminum, the aluminum alloy with the alloying component of copper, and the aluminum alloy with the alloying component of silicon in Na2SO4 solution in accordance with some embodiments.

It is noted that one of the proposed materials for the metal gate layer 102g is aluminum alloy with alloying component of silicon. The aluminum alloy with alloying component of silicon has a corrosion resistance higher than the corrosion resistance of the aluminum alloy with the alloying component of copper and also higher than the corrosion resistance of the pure aluminum. FIG. 2 is a diagram illustrating the corrosion behaviours (i.e. the curves 202, 204, and 206) of the pure aluminum, i.e. Al, the aluminum alloy with the alloying component of copper, i.e. Al+Cu, and the aluminum alloy with the alloying component of silicon, i.e. Al+Si, in Na2SO4 solution in accordance with some embodiments. The curves 202, 204, and 206 exhibit Tafel type behaviour. X-axis represents the negative potential (−V) and Y-axis represents the negative current density in logarithmic scale (−log(J)). As shown in FIG. 2, the current density corresponding to Al+Si (i.e. 206) is more stable than the current density of Al+Cu (i.e. 204) whereas the current density of Al+Cu (i.e. 204) is more stable than the current density of Al (i.e. 202). Therefore, Al+Si is the most noble metal in comparison to Al+Cu and Al.

Figure 3:
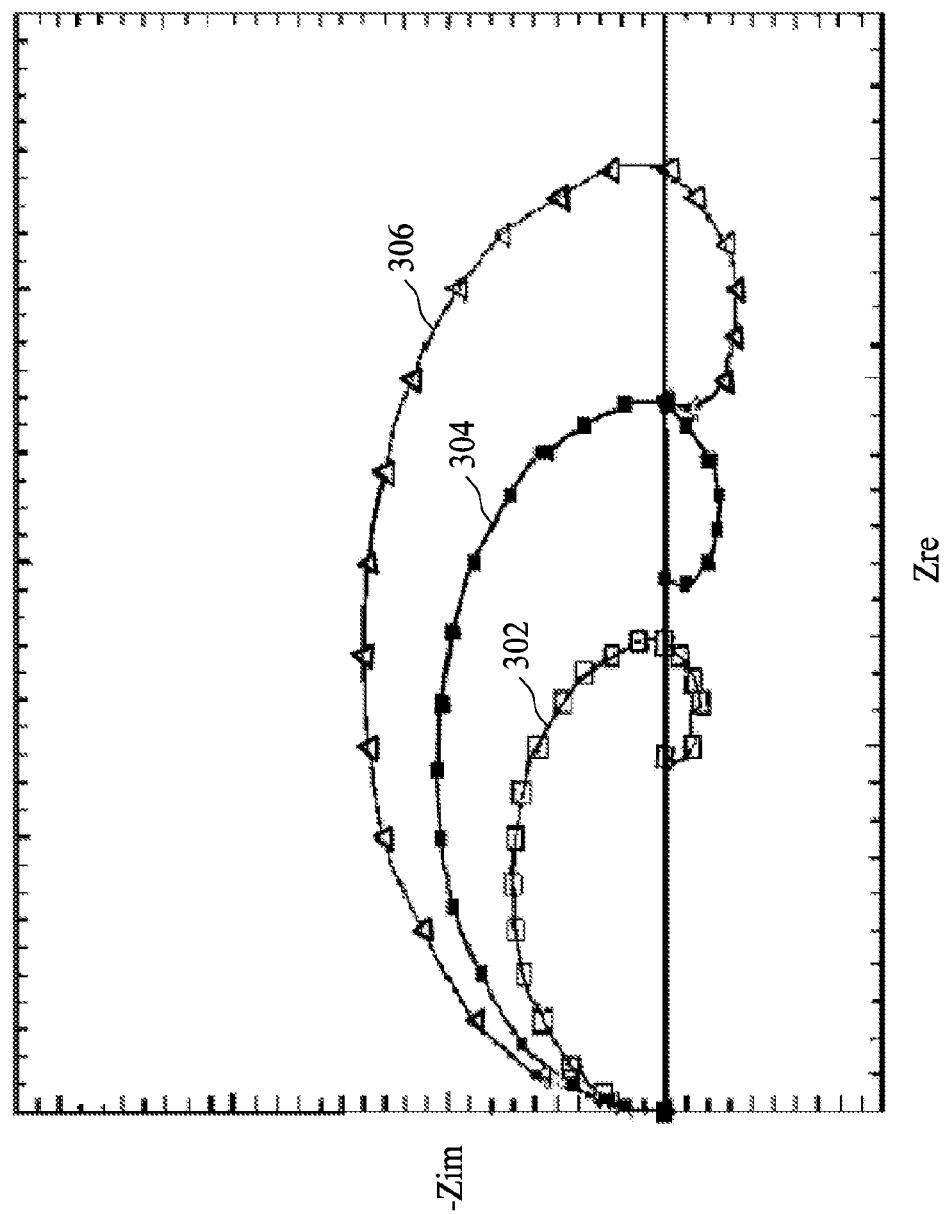
FIG. 3 is a diagram illustrating the complex impedance plots of Al, Al+Cu, and Al+Si in Na2SO4 solution in accordance with some embodiments.

In addition, FIG. 3 is a diagram illustrating complex impedance plots (i.e. the curves 302, 304, and 306) of Al, Al+Cu, and Al+Si in Na2SO4 solution in accordance with some embodiments. X-axis represents the real part (i.e. Zre) of the complex impedance and Y-axis represents the negative imaginary part (i.e. −Zim) of the complex impedance. As shown in FIG. 3, the complex impedance corresponding to Al+Si (i.e. 306) is larger than the complex impedance of Al+Cu (i.e. 304) whereas the complex impedance of Al+Cu (i.e. 304) is larger than the complex impedance of Al (i.e. 302). Therefore, Al+Si have the largest corrosion resistance in comparison to the corrosion resistances of Al+Cu and Al. The corrosion resistance of a metal alloy with the silicon is higher than the corrosion resistance of a metal alloy without the silicon.

Figure 4:
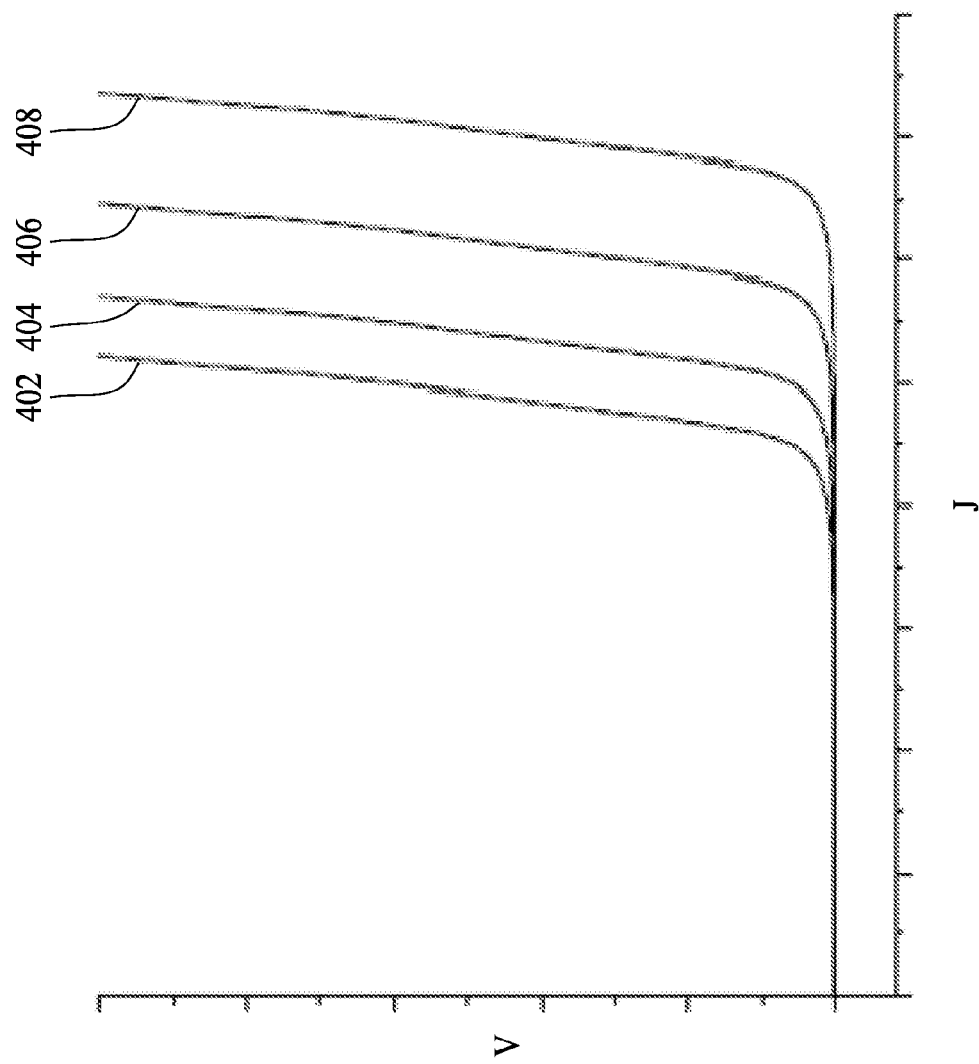
FIG. 4 is a diagram illustrating the ionization behaviours of the pure Al and Al alloy with different weightings of Si in accordance with some embodiments.

Moreover, FIG. 4 is a diagram illustrating the ionization behaviours of pure Al and Al alloy with different weightings of Si in accordance with some embodiments. X-axis represents the ionization potential (V) and Y-axis represents the current density in linear scale (J). The curve 402 represents the ionization behaviour of the pure Al. The curve 404 represents the ionization behaviour of Al alloy with 6% of Si, i.e. Al+6% Si. The curve 406 represents the ionization behaviour of Al alloy with 12% of Si, i.e. Al+12% Si. The curve 408 represents the ionization behaviour of Al alloy with 18% of Si, i.e. Al+18% Si. As shown in FIG. 4, the ionization potential causing Al+6% Si to generate a steep current (i.e. ionize) is larger than the ionization potential of pure Al. The ionization potential causing Al+12% Si to generate a steep current is larger than the ionization potential of Al+6% Si. The ionization potential causing Al+18% Si to generate a steep current is larger than the ionization potential of Al+12% Si. Therefore, the Al alloy exhibits more noble or more stable characteristic when the more weighting of Si is alloyed in Al.

Figure 5:
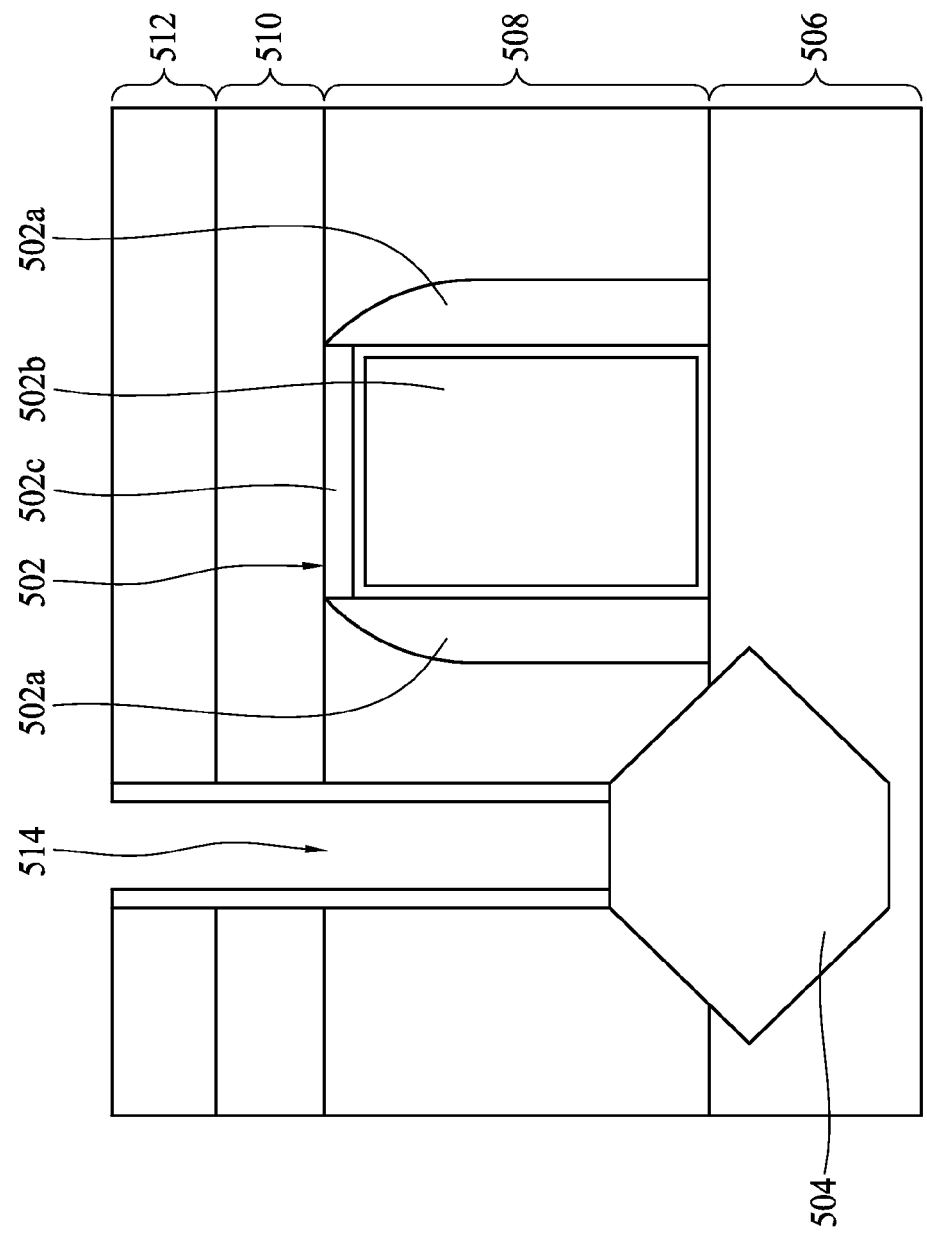
FIG. 5 is a cross-sectional view of a semiconductor device in accordance with some embodiments.

Accordingly, when the present metal alloy (e.g. Al—Si—Cu) is applied as the filling material of the metal gate layer 102g, the metal gate layer 102g has a high corrosion resistance against the sulphate solutions during contact forming process of the semiconductor device 100. FIG. 5 is a cross-sectional view of a semiconductor device 500 in accordance with some embodiments. The semiconductor device 500 includes a gate stack 502, an S/D region 504 (or a raised S/D region), a substrate 506, an ILD 508, a contact etch stop layer (CESL) 510, a plasma-enhanced oxide layer (PEOX) 512, and a contact opening 514. The gate stack 502 is over the substrate 506 and surrounded by the ILD 508. The S/D region 504 is aside of the gate stack 502. The CESL 510 is disposed over the ILD 508 and the gate stack 502. The CESL 510 may be formed by the material of silicon nitride (SiN). The PEOX 512 is disposed over the CESL 510. The contact opening 514 is an opening to expose the S/D region 504. A contact (not shown in FIG. 5) is to be formed in the contact opening 514.

The gate stack 502 includes a spacer 502a, a metal gate layer 502b, and a hard mask 502c. The metal gate layer 502b is in the spacer 502a. Same as the metal gate layer 102g in FIG. 1, the metal gate layer 502b is a metal alloy at least including an alloying component of silicon (Si). In an embodiment, the metal alloy further has alloying components of copper (Cu) and aluminum (Al), i.e. Al—Si—Cu. The hard mask 502c is disposed over the metal gate layer 502b. It is noted that the other functional layers between the spacer 502a and the metal gate layer 502b are omitted here for brevity.

The contact opening 514 passes through the PEOX 512, the CESL 510, and the ILD 508 to reach the S/D region 504. To form the contact opening 514, the semiconductor device 500 may undergo an etching process. During the etching process, an etchant is used to remove the material surrounded by the contact opening 514. The material being removed may be the carbon-containing polymer. More specifically, the etchant is arranged to flow into the contact to the remove the carbon-containing polymer. The etchant may be the sulphate solutions. As shown in FIG. 5, the metal gate layer 502b and the contact opening 514 are separated by merely the ILD 508 and the spacer 502a, the etchant may penetrate the ILD 508 and the spacer 502a to reach the metal gate layer 502b. In the embodiments, the metal gate layer 502b is formed by the Al alloy having the alloying component of Si and Cu, thus the metal gate layer 502b has a high corrosion resistance against the etchant even when the etchant reaches the metal gate layer 502b during the etching process. As a result, the metal gate layer 502b can be kept intact after the forming of the contact opening 514. The metal gate missing problem is improved.

Figure 6:
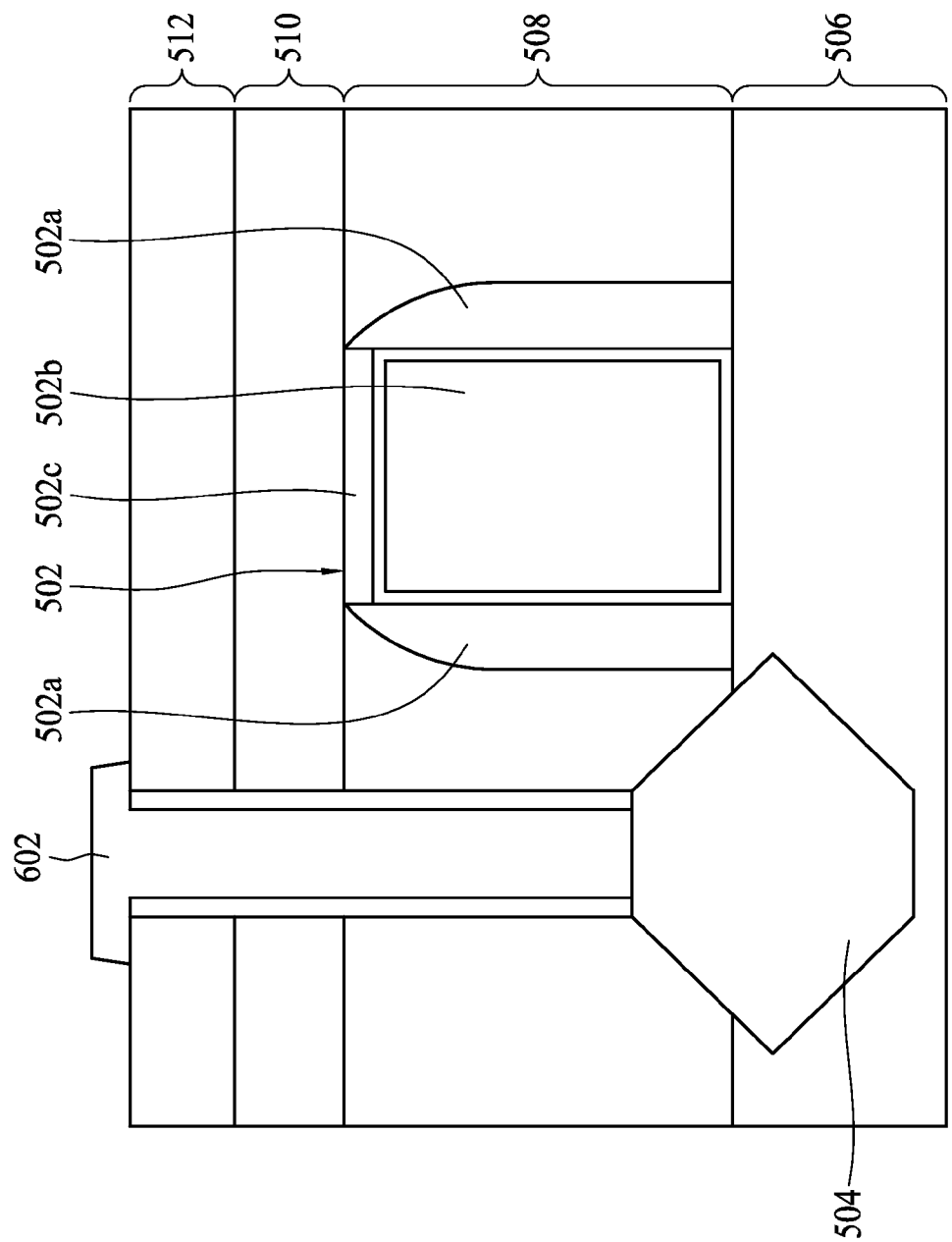
FIG. 6 is a cross-sectional view of a semiconductor device in accordance with some embodiments.

FIG. 6 is a cross-sectional view of a semiconductor device 600 in accordance with some embodiments. In comparison to the semiconductor device 500 in FIG. 5, a contact 602 is further included. The contact 602 is formed in the contact opening 514 to couple to the S/D region 504. The materials of the contact 602 may be silicide materials, such as nickel silicide (NiSi), nickel-platinum silicide (NiPtSi), nickel-platinum germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The contact 602 may be formed by CVD, PVD, ALD, electrolytic plating, electroless plating, and epitaxial deposition.

Figure 7:
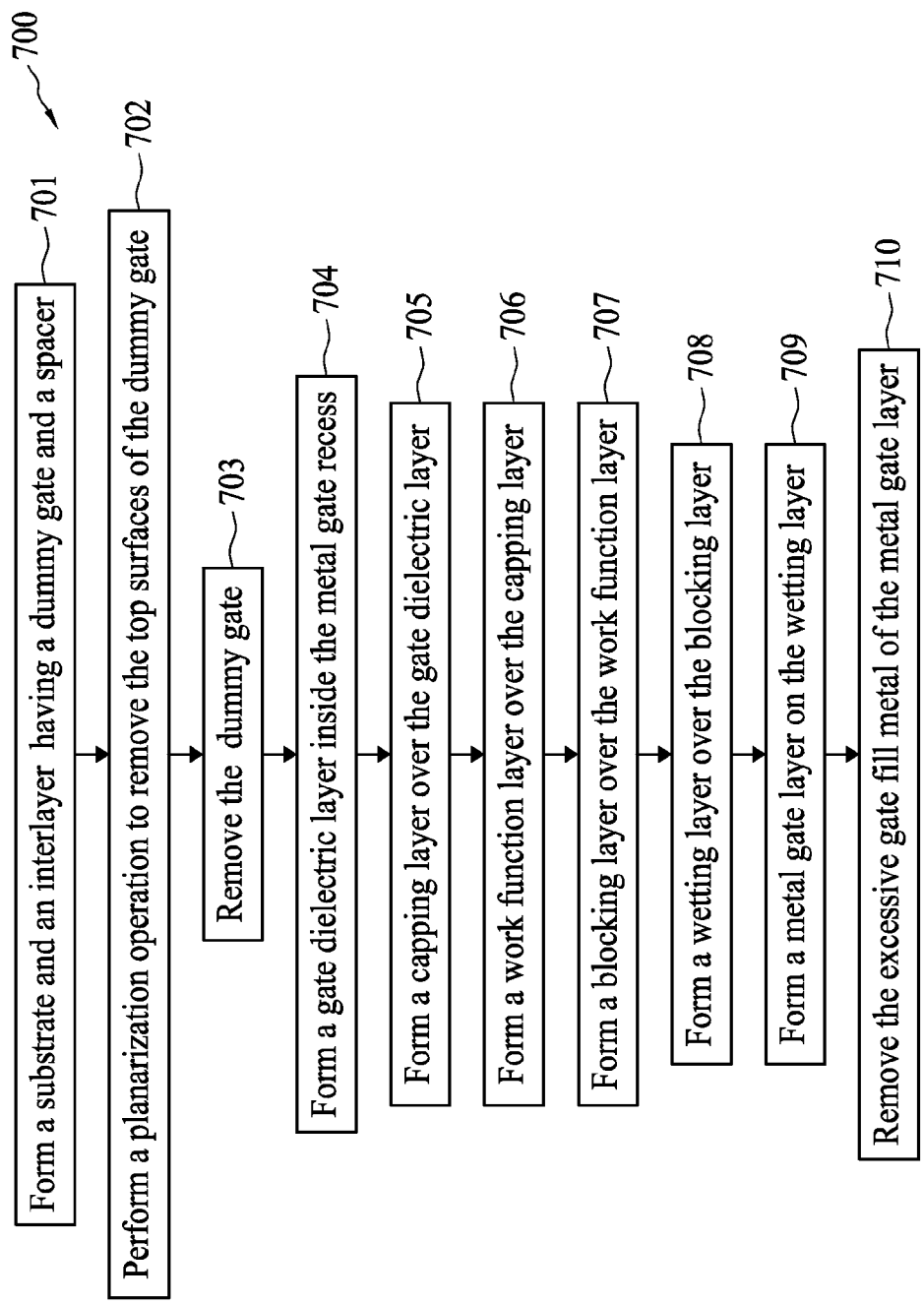
FIG. 7 is a flow diagram illustrating a method of fabricating a semiconductor device in accordance with some embodiments.
Figure 8:
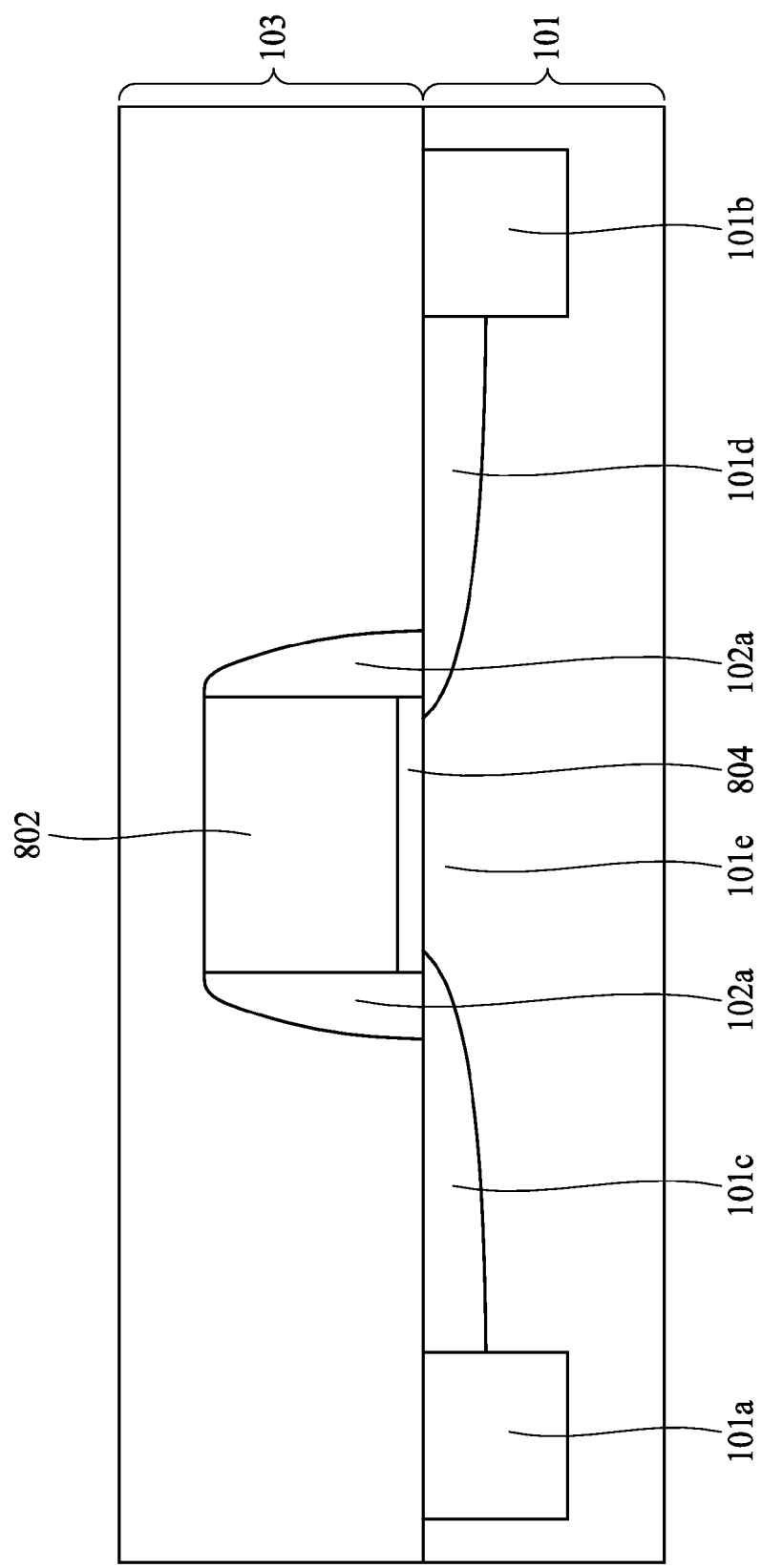
FIG. 8 is a cross-sectional view of a dummy gate formed on the substrate during fabrication in accordance with some embodiments.
Figure 9:
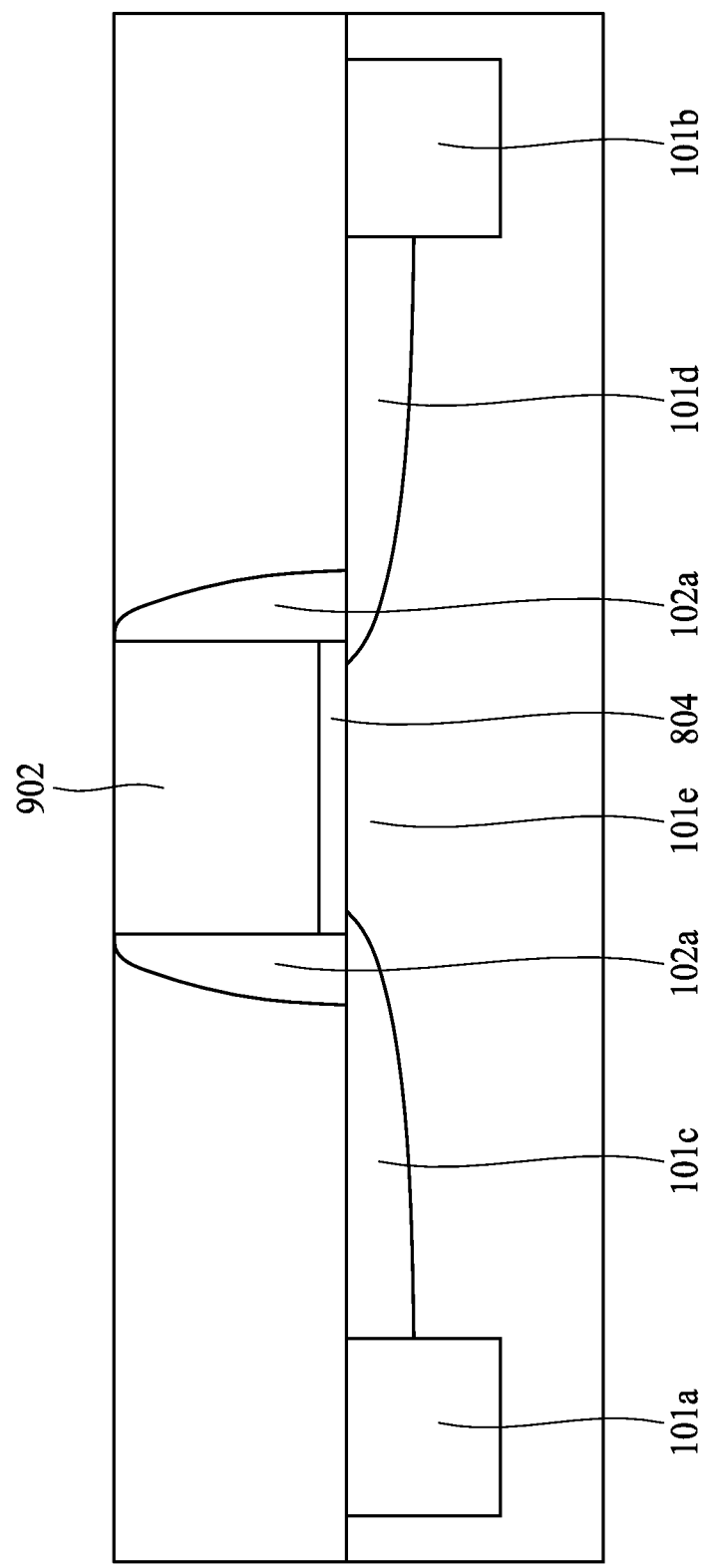
FIG. 9 is a cross-sectional view of an exposed dummy gate during fabrication in accordance with some embodiments.
Figure 10:
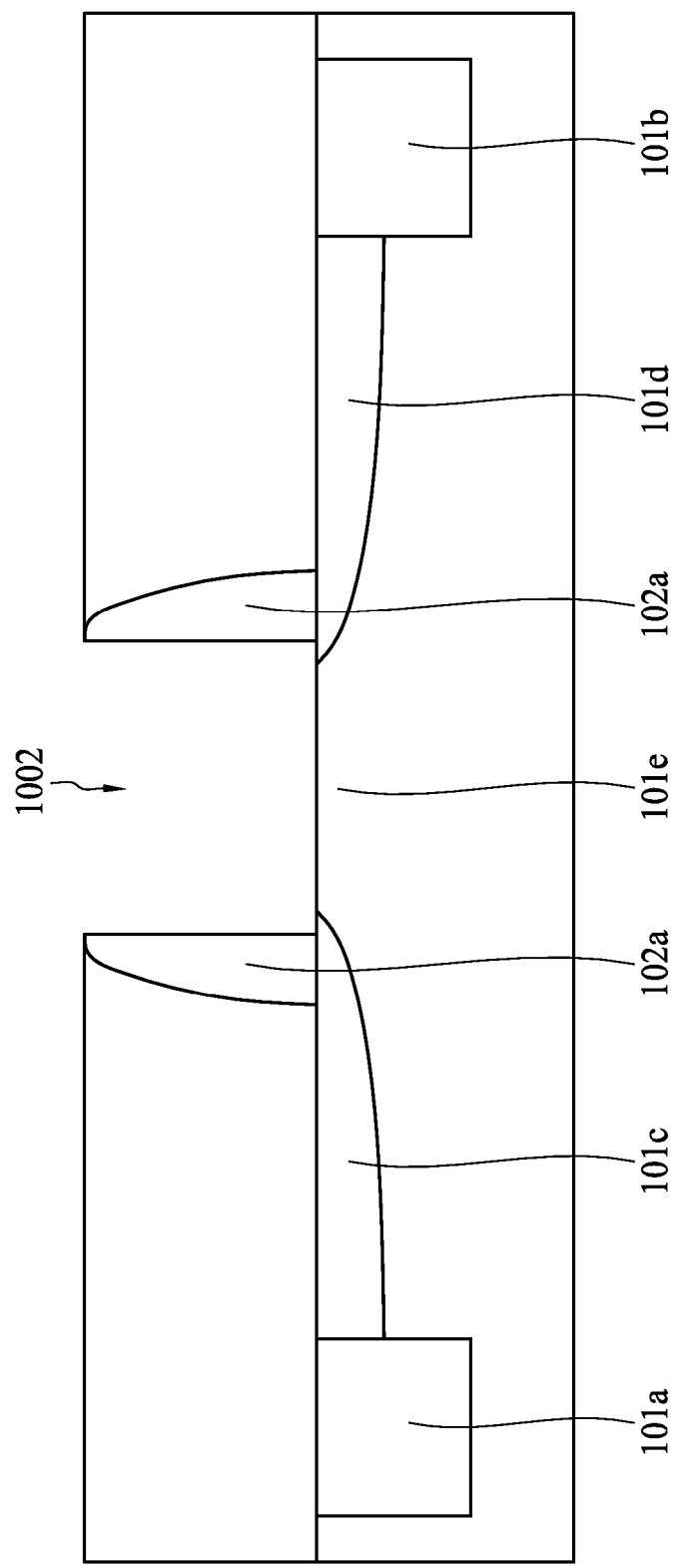
FIG. 10 is a cross-sectional view of a metal gate recess during fabrication in accordance with some embodiments.
Figure 11:
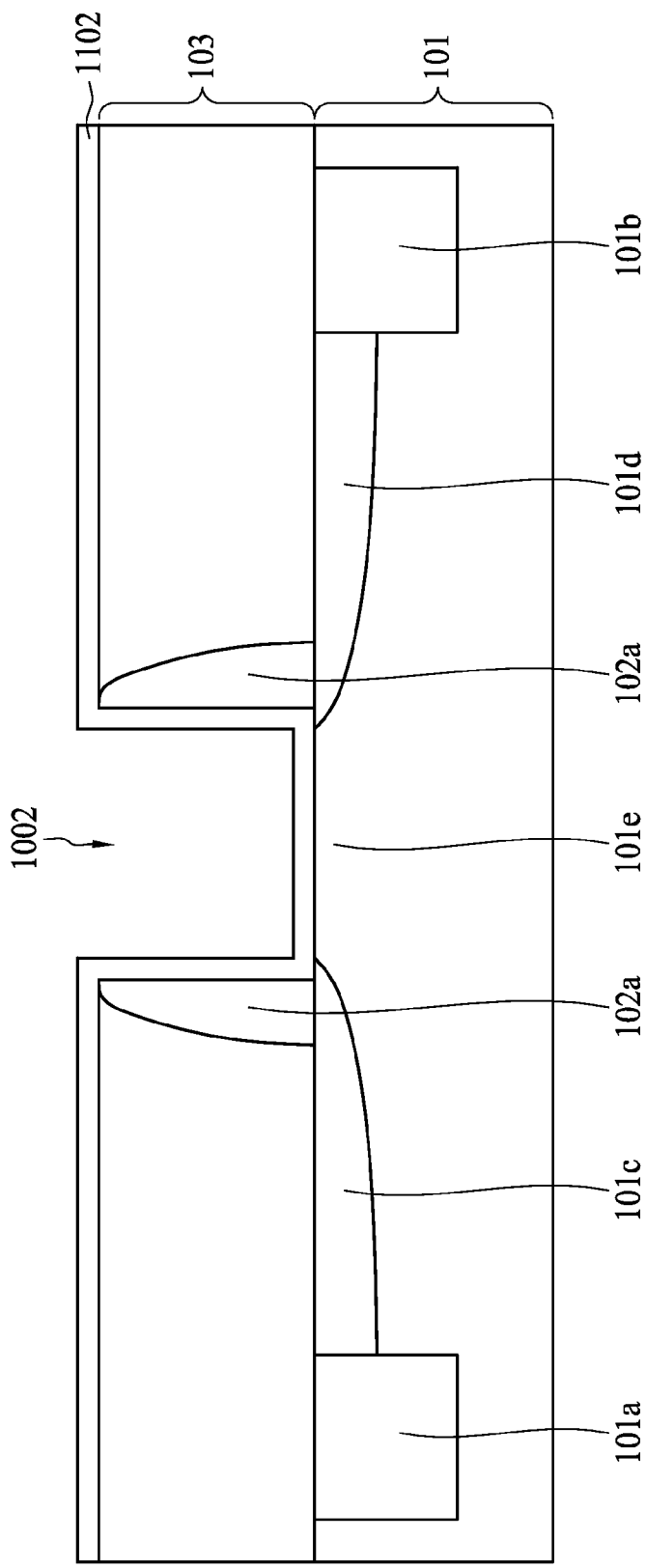
FIG. 11 is a cross-sectional view of a gate dielectric layer during fabrication in accordance with some embodiments.
Figure 12:
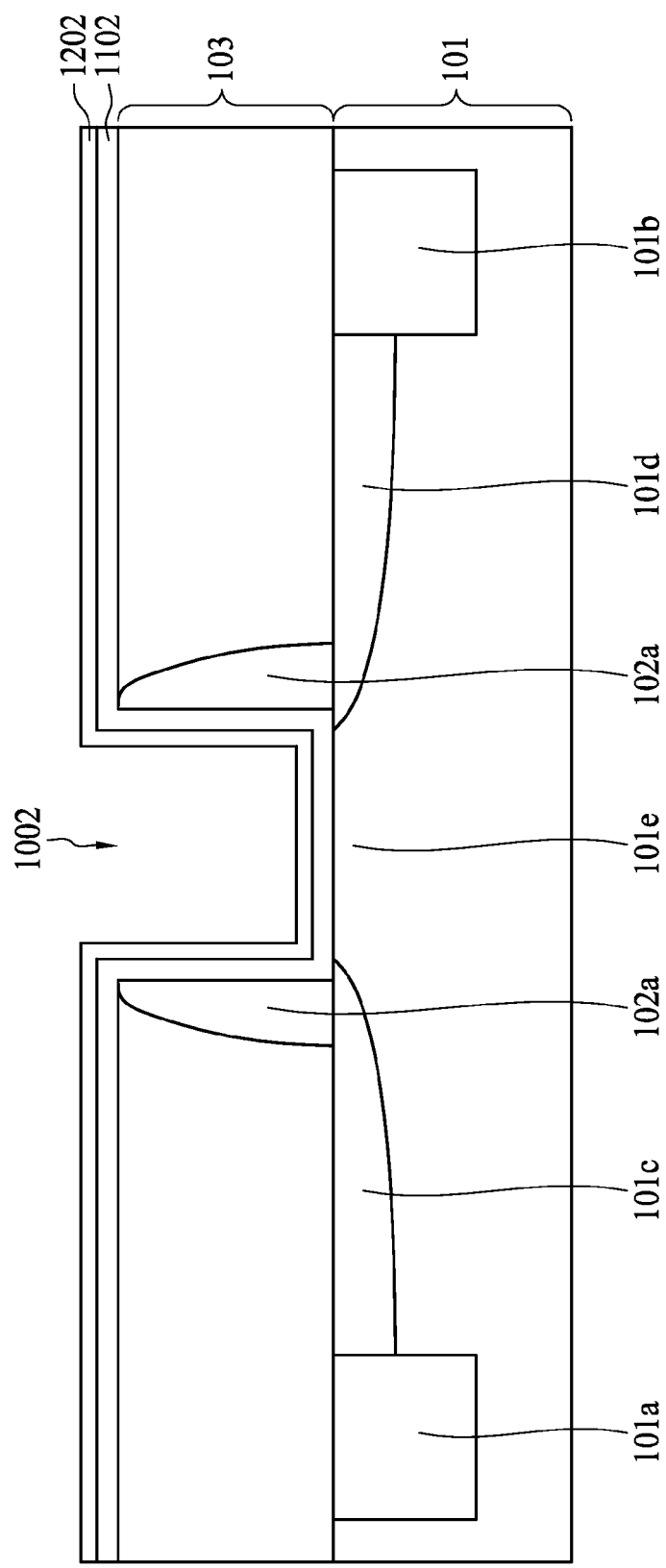
FIG. 12 is a cross-sectional view of a capping layer during fabrication in accordance with some embodiments.
Figure 13:
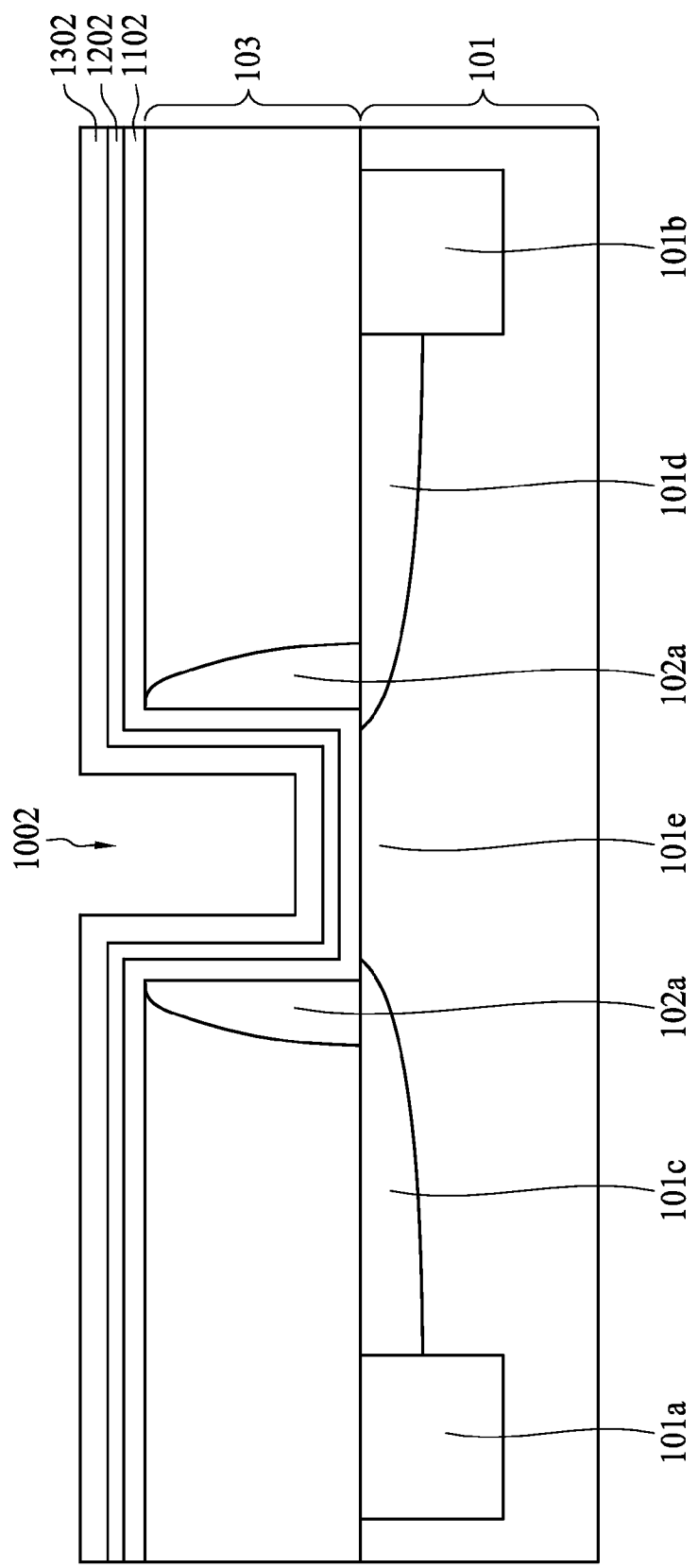
FIG. 13 is a cross-sectional view of a work function layer during fabrication in accordance with some embodiments.
Figure 14:
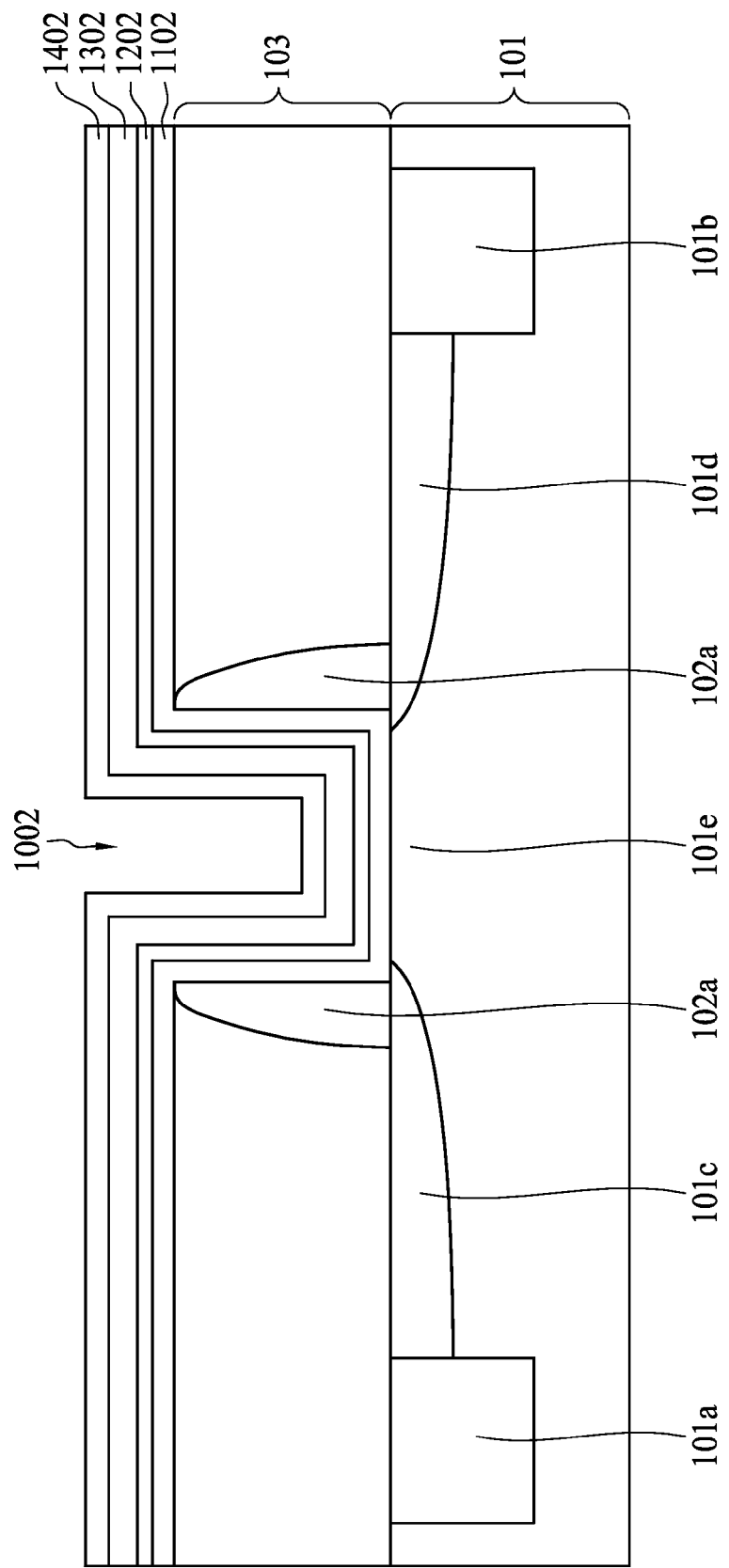
FIG. 14 is a cross-sectional view of a blocking layer during fabrication in accordance with some embodiments.
Figure 15:
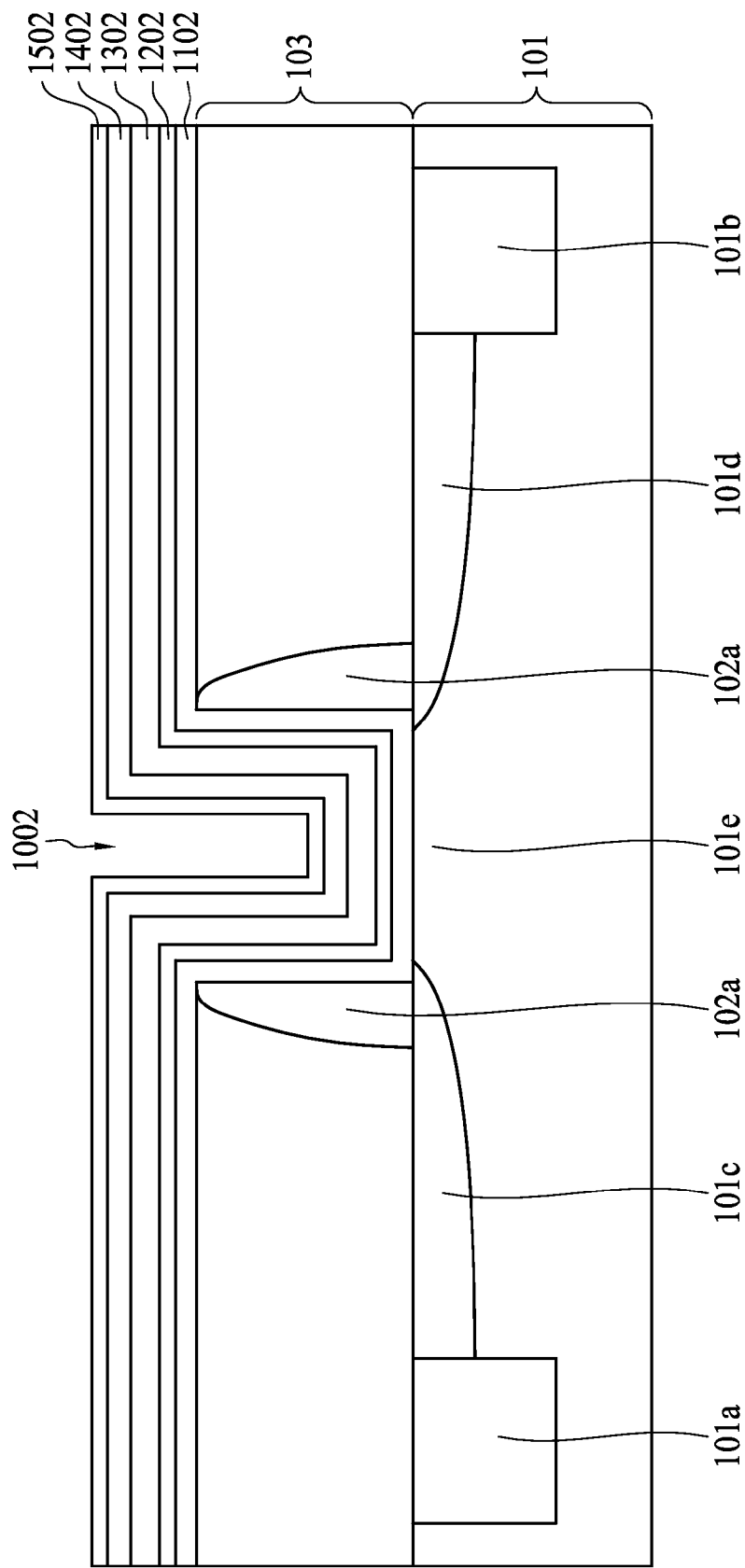
FIG. 15 is a cross-sectional view of a wetting layer during fabrication in accordance with some embodiments.
Figure 16:
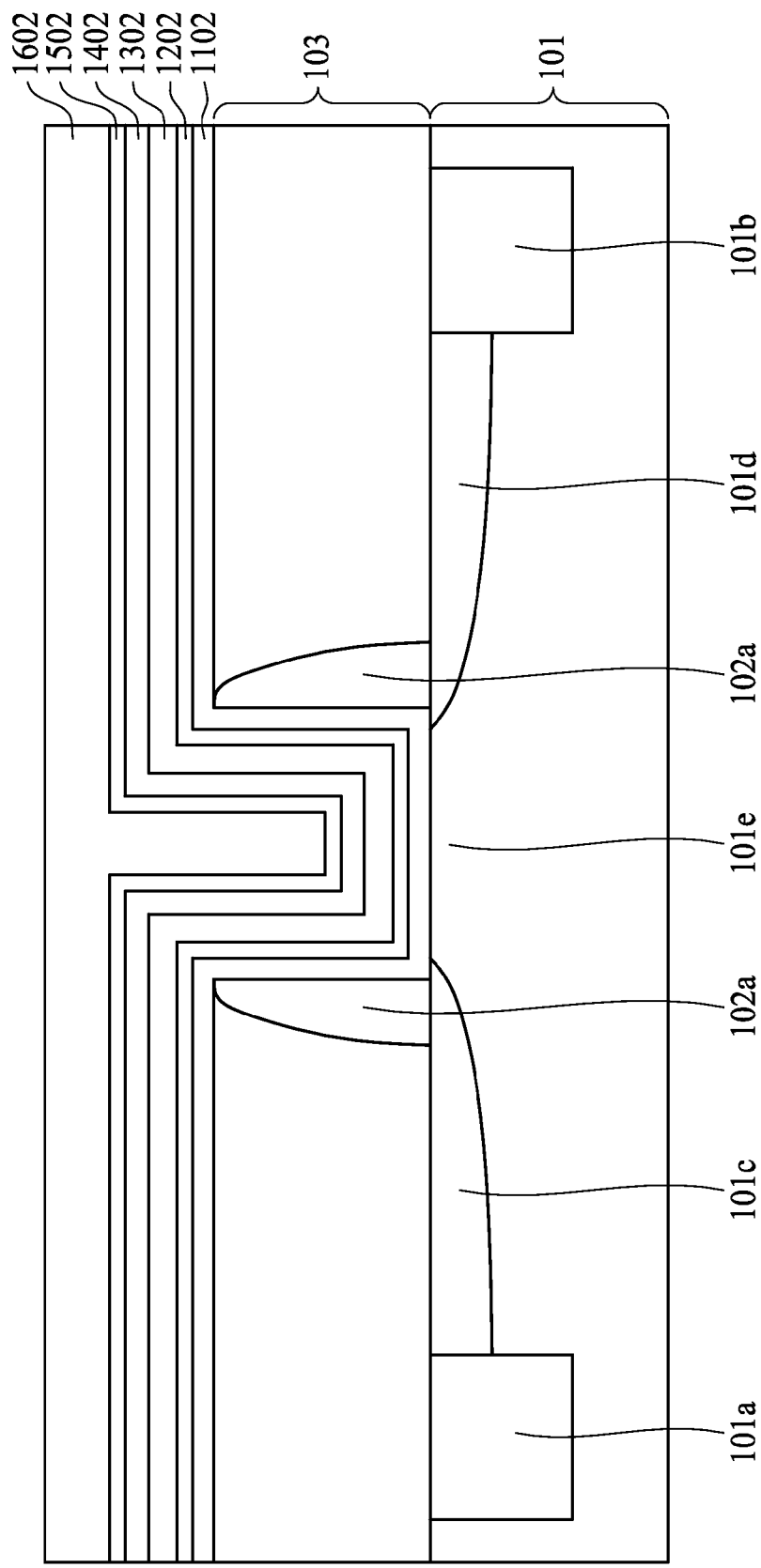
FIG. 16 is a cross-sectional view of a metal gate layer during fabrication in accordance with some embodiments.

Moreover, by using the proposed metal alloy (e.g. Al—Si—Cu) as the filling material of the metal gate layer 102g, the metal gate layer 102g also obtains a great advantage during the chemical mechanical polishing or planarization (CMP) process of the gate stack 102. FIG. 7 is a flow diagram illustrating a method 700 of fabricating the semiconductor device 100 in accordance with some embodiments. FIGS. 8-17 are diagrams illustrating stages in the fabrication of the semiconductor device 100 in accordance with some embodiments. Specifically, FIG. 8 is a cross-sectional view of a dummy gate 802 formed on the substrate 101 during fabrication in accordance with some embodiments. FIG. 9 is a cross-sectional view of an exposed dummy gate 902 during fabrication in accordance with some embodiments. FIG. 10 is a cross-sectional view of a metal gate recess 1002 during fabrication in accordance with some embodiments. FIG. 11 is a cross-sectional view of a gate dielectric layer 1102 during fabrication in accordance with some embodiments. FIG. 12 is a cross-sectional view of a capping layer 1202 during fabrication in accordance with some embodiments. FIG. 13 is a cross-sectional view of a work function layer 1302 during fabrication in accordance with some embodiments. FIG. 14 is a cross-sectional view of a blocking layer 1402 during fabrication in accordance with some embodiments. FIG. 15 is a cross-sectional view of a wetting layer 1502 during fabrication in accordance with some embodiments. FIG. 16 is a cross-sectional view of a metal gate layer 1602 during fabrication in accordance with some embodiments. The method is a simplified semiconductor process. Therefore, other steps or operations may be incorporated in the process.

Referring to FIG. 7 and FIG. 8, in operation 701, the substrate 101 is provided, and the first S/D region 101c, the second S/D region 101d, the first STI region 101a, and the second STI region 101b are formed in the substrate 101. Then, the dummy gate 802 and the spacer 102a are formed on the substrate 101. The spacer 102a is formed on the sidewall of the dummy gate 802. The ILD 103 is then formed to cap the ILD 103.

Materials forming the spacer 102a include, but are not limited to, silicon nitride, silicon oxide, silicon oxynitride or a combination thereof. In some embodiments, the spacer 102a is a silicon nitride film formed by a hot wall, low pressure chemical vapor deposition (LPCVD) operation.

In the embodiments, an interlayer 804 is formed between the dummy gate 802 and the channel region 101e. The interlayer 804 is a protective layer for the underlying substrate 101 when the dummy gate 802 is removed or etched. If the interlayer 804 is thermally grown dielectrics, the interlayer 804 will be formed only on the exposed surfaces of the substrate 101.

Referring to FIG. 7 and FIG. 9, in operation 702, a planarization operation such as a chemical mechanical polishing (CMP) operation is performed after formation of ILD 103. The planarization operation is carried out to remove the excessive ILD 103 over the top surfaces of the dummy gate 802 until the dummy gate 802 are exposed from the ILD 103, i.e. the exposed dummy gate 902 as shown in FIG. 9.

Referring to FIG. 7 and FIG. 10, in operation 703, the metal gate recess 1002 is formed by removing the dummy gate 802. In the embodiments, the dummy gate 802 is formed of polysilicon. The polysilicon dummy gate 802 may be removed by utilizing a wet etchant including tetramethylammonium hydroxide and water.

In an embodiment, the wet etchant solution includes about 10-35% tetramethylammonium hydroxide by volume. The tetramethylammonium hydroxide solution is heated to a temperature between 60-95 degrees Celsius during etching. Sonic energy such as, ultrasonic or megasonic energy, is applied during the etch process. Sonic energy provides agitation to the etchant which enables etch residue to be removed from altered dummy gate 802 and allows new etchants to enter into the trenches so as to etch the dummy gate 802.

In the embodiments, the etchant for the dummy gate 802 is selective to the interlayer 804, so that the interlayer 804 act as an etch stop for the etchant. Therefore, the underlying channel region 804 of the metal gate recess 1002 is protected from the etchant.

The interlayer 804 is removed after the removal of the dummy gate 802. In an embodiment, the interlayer 804 is oxide and can be removed with an etchant including aqueous hydrofluoric acid. In an embodiment, an etchant solution with 1-2% HF by volume is used.

Referring to FIG. 7 and FIG. 11, in operation 704, the gate dielectric layer 1102 is formed in a conformal manner inside the metal gate recess 1002 and on the top of the ILD 103. In the embodiments, the gate dielectric layer 1102 is high-k dielectric layer, and high-k dielectric layer directly forms proximal to the channel region 101e of the substrate 101.

In an embodiment, the gate dielectric layer 1102 is a deposited dielectric. The deposited dielectric may be a metal oxide dielectric, such as tantalum pentoxide ($Ta_2O_5$) and titanium oxide ($TiO_2$), tantalum oxide, hafnium oxide, zirconium oxide, aluminum oxide, lanthanum oxide, lanthanum aluminum oxide and silicates thereof or other high k dielectrics. The high-k dielectric film can be formed by, but not limited to, chemical vapor deposition (CVD) or atomic layer deposition (ALD).

Referring to FIG. 7 and FIG. 12, in operation 705, the capping layer 1202 is formed on the gate dielectric layer 1102 and in the gate metal recess 1002. As described in the above paragraph, the capping layer 1202 functions as a barrier to protect the gate dielectric layer 102b, and the capping layer 1202 may be formed by various semiconductor deposition techniques.

In some embodiments, the capping layer 1202 may include a composite film stack. For example, the composite film stack can be made of any of the two metal carbonitride layers, TiN and TaN.

Referring to FIG. 7 and FIG. 13, in operation 706, the work function layer 1302 is formed on the capping layer 1202 and in the gate metal recess 1002. A patterning technology may be applied to form the work function layer 1302. The work function layer 1302 decides the type of the transistor, i.e. the NFET or the PFET. As mentioned in the above paragraph, the work function layer 1302 can be formed by an atomic layer deposition, a physical vapor deposition, a chemical vapor deposition, sputtering, or other suitable operations.

In some embodiments, aluminum atom is doped within the work function layer 1302 via an ALD operation. The aluminum ion implantation operation is carried out after the formation of the work function layer 1302 in order to adjust the threshold voltage of the forming FET.

Referring to FIG. 7 and FIG. 14, in operation 707, the blocking layer 1402 is formed on the work function layer 1302 and in the gate metal recess 1002. The blocking layer 1402 can be formed by various deposition techniques such as PVD, CVD, ALD, PECVD, RPCVD, MOCVD, sputtering, plating, other suitable method, or combinations thereof.

Referring to FIG. 7 and FIG. 15, in operation 708, the wetting layer 1502 is formed on the blocking layer 1402 and in the gate metal recess 1002. The wetting layer 1502 can be formed by various deposition techniques such as PVD, CVD, ALD, PECVD, RPCVD, MOCVD, sputtering, plating, other suitable method, or combinations thereof.

Referring to FIG. 7 and FIG. 16, in operation 709, the metal gate layer 1602 is formed on the wetting layer 1502 and in the gate metal recess 1002. The filling material of the metal gate layer 1602 is the proposed metal alloy (e.g. Al—Si—Cu). In the embodiments, the filling material over-fills the gate metal recess 1002 in order to fully fill the gate metal recess 1002. The metal gate layer 1602 can be formed through various deposition techniques such as PVD, CVD, ALD, PECVD, RPCVD, MOCVD, sputtering, plating, other suitable method, or combinations thereof.

In one embodiment, the metal gate layer 1602 is formed by sputtering an Al—Si—Cu target on the wetting layer 1502. It is noted that the concentration of the Al—Si—Cu target may be different from the percentages of the alloying components of the present metal alloy.

In another embodiment, a metal alloy having alloying component of aluminum and copper is first disposed over the wetting layer 1502. Then, the metal gate layer 1602 is formed by doping silicon into the metal alloy having alloying component of aluminum and copper.

In another embodiment, the aluminum is first disposed over the wetting layer 1502. Then, the metal gate layer 1602 is formed by doping silicon and copper into the aluminum.

Referring to FIG. 7 and FIG. 1, in operation 710, a CMP operation or/and an etching operation is performed upon the metal gate layer 1602 to remove the excessive gate fill metal of the metal gate layer 1602. In the embodiments, the gate dielectric layer 1102, the capping layer 1202, the work function layer 1302, the blocking layer 1402, and the wetting layer 1502 are also removed from the top surface of the ILD 103. As mentioned in above paragraph, the metal gate layer 1602 with the metal alloy of Al—Si—Cu has a high corrosion resistance against the etchant, thus the metal gate layer 1602 is not over-etched by the etchant, acid, or sulphate solution using in the operation 710. Accordingly, as shown in FIG. 1, the upper surfaces of the ILD 103, the gate dielectric layer 102b, the capping layer 102c, the work function layer 102d, the blocking layer 102e, the wetting layer 102f, and the metal gate layer 102g are flat and smooth after the CMP operation or/and the etching operation, and no etch-back trench is formed on the upper surface of the metal gate layer 102g.

Briefly, by using the aluminum alloy with the alloying component of silicon and copper to be the filling metal of the metal gater layer 102g, the metal gater layer 102g has a high corrosion resistance against the etchant, acid, or sulphate solution during the manufacturing process of the semiconductor device 100. Therefore, the metal gate missing/defect problem is solved.

Moreover, the scope of the present application is not intended to be limited to the particular embodiments of the process, machine, manufacture, and composition of matter, means, methods and steps described in the specification. As those skilled in the art will readily appreciate form the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure.

Accordingly, the appended claims are intended to include within their scope such as processes, machines, manufacture, and compositions of matter, means, methods or steps. In addition, each claim constitutes a separate embodiment, and the combination of various claims and embodiments are within the scope of the disclosure.

In some embodiments, a semiconductor device includes a substrate, a first and second source/drain regions on the substrate, and a gate stack. The first and second source/drain regions are disposed on the substrate. The gate stack is disposed over the substrate to overlay a channel region between the first and second S/D regions. The gate stack includes a gate dielectric layer and a metal alloy. The gate dielectric layer is disposed over the substrate. The metal alloy is disposed on the gate dielectric layer and configured as a filling layer in the gate stack, wherein the metal alloy has a first corrosion resistance corresponding to an etchant designed for removing a carbon-containing polymer.

In some embodiments, a semiconductor device includes a substrate, a first and second source/drain regions on the substrate, and a gate stack. The first and second source/drain regions disposed on the substrate. The gate stack is disposed over the substrate to overlay a channel region between the first and second S/D regions. The gate stack includes a gate dielectric layer and a metal gate layer. The gate dielectric layer is disposed over the substrate. The metal gate layer is disposed on the gate dielectric layer, and the metal gate layer includes a fill metal having a component of silicon.

In some embodiments, a method for fabricating a semiconductor device includes: providing a substrate; forming a first and second source/drain (S/D) regions on the substrate; and forming a gate stack over the substrate to overlay a channel region between the first and second S/D regions, including: forming a gate dielectric layer over the substrate; and forming a metal alloy on the gate dielectric layer to be a filling layer in the gate stack; wherein the metal alloy has a first corrosion resistance corresponding to an etchant designed for removing a carbon-containing polymer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a substrate;
a first and second source/drain regions on the substrate; and
a gate stack disposed over the substrate to overlay a channel region between the first and second S/D regions, the gate stack comprising:
a gate dielectric layer, disposed over the substrate;
a metal alloy, disposed on the gate dielectric layer and configured as a filling layer in the gate stack;
a work function layer, disposed over the gate dielectric layer;
a blocking layer, disposed over the work function layer; and
a wetting layer, disposed over the blocking layer;
wherein the metal alloy is disposed over the wetting layer, and the metal alloy has a first corrosion resistance corresponding to an etchant designed for removing a carbon-containing polymer.

2. The semiconductor device of claim 1, wherein the metal alloy comprises a percentage of silicon at least about 0.2%.

3. The semiconductor device of claim 2, wherein the first corrosion resistance is higher than a second corrosion resistance of a metal alloy without the silicon.

4. The semiconductor device of claim 2, wherein the metal alloy further comprises a percentage of copper at least about 0.5%.

5. The semiconductor device of claim 1, wherein the metal alloy comprises a first alloying component of silicon, a second alloying component of copper, and third alloying component of aluminum.

6. The semiconductor device of claim 1, wherein the gate dielectric layer surrounds the metal alloy.

7. The semiconductor device of claim 1, wherein the gate stack further comprises:
 a capping layer, disposed between the gate dielectric layer and the work function layer.

8. The semiconductor device of claim 1, wherein the gate stack further comprises:
 a non-conductive spacer, configured to be a side wall of the gate stack.

9. A method for fabricating a semiconductor device, comprising:
 providing a substrate;
 forming a first and second source/drain (S/D) regions on the substrate; and
 forming a gate stack over the substrate to overlay a channel region between the first and second S/D regions, comprising:
  forming a gate dielectric layer over the substrate; and
  forming a metal alloy on the gate dielectric layer to be a filling layer in the gate stack;
 wherein the metal alloy has a first corrosion resistance corresponding to an etchant designed for removing a carbon-containing polymer, and forming the metal alloy includes sputtering an Al—Si—Cu target.

10. The method of claim 9, further comprising forming a dielectric around the gate stack.

11. The method of claim 9, further comprising forming a contact opening adjacent to the gate stack, wherein the contact opening exposes the first and second source/drain (S/D) regions.

12. The method of claim 11, further comprising flowing the etchant into the contact opening to remove the carbon-containing polymer.

13. The method of claim 9, wherein the first corrosion resistance is higher than a second corrosion resistance of a metal alloy without the silicon.

14. The method of claim 8, further comprising:
 forming a non-conductive spacer to be a side wall of the gate stack.

15. The method of claim 8, wherein forming the gate stack over the substrate to overlay the channel region between the first and second S/D regions further comprises:
 forming a work function layer over the gate dielectric layer;
 forming a blocking layer over the work function layer; and
 forming a wetting layer over the blocking layer;
 wherein the metal alloy is disposed over the wetting layer.

16. The method of claim 15, wherein forming the gate stack over the substrate to overlay the channel region between the first and second S/D regions further comprises:
 forming a capping layer in between the gate dielectric layer and the work function layer.

17. The method of claim 9, wherein the gate stack is formed in an interlayer dielectric layer (ILD) disposed on the substrate, and the method further comprises:
 etching the ILD to form a contact opening to expose one of the first and second source/drain (S/D) regions by using the etchant.

18. The method of claim 17, wherein the method further comprises:
 forming a contact in the contact opening to couple to the one of the first and second source/drain (S/D) regions.

19. A method for fabricating a semiconductor device, comprising:
 providing a substrate;
 forming a first and second source/drain (S/D) regions on the substrate; and
 forming a gate stack over the substrate to overlay a channel region between the first and second S/D regions, comprising:
  forming a gate dielectric layer over the substrate;
  forming a metal alloy on the gate dielectric layer to be a filling layer in the gate stack;
  forming a work function layer over the gate dielectric layer;
  forming a blocking layer over the work function layer; and
  forming a wetting layer over the blocking layer;
 wherein the metal alloy is disposed over the wetting layer, and the metal alloy has a first corrosion resistance corresponding to an etchant designed for removing a carbon-containing polymer.

* * * * *